(12) United States Patent
Matsuura et al.

(10) Patent No.: US 10,935,428 B2
(45) Date of Patent: Mar. 2, 2021

(54) SPECTRUM MEASUREMENT APPARATUS AND SPECTRUM MEASUREMENT METHOD

(71) Applicants: TOHOKU TECHNO ARCH CO., LTD., Sendai (JP); HAMAMATSU PHOTONICS K.K., Hamamatsu (JP)

(72) Inventors: Yuji Matsuura, Sendai (JP); Naoto Shibata, Sendai (JP)

(73) Assignees: TOHOKU TECHNO ARCH CO., LTD., Sendai (JP); HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/797,317

(22) Filed: Feb. 21, 2020

(65) Prior Publication Data
US 2020/0271520 A1 Aug. 27, 2020

(30) Foreign Application Priority Data
Feb. 25, 2019 (JP) .............................. JP2019-031782

(51) Int. Cl.
| | | |
|---|---|---|
| *G01J 3/42* | (2006.01) | |
| *H01S 5/14* | (2006.01) | |
| *G02B 5/18* | (2006.01) | |
| *H01S 5/34* | (2006.01) | |

(52) U.S. Cl.
CPC .............. *G01J 3/42* (2013.01); *G02B 5/1814* (2013.01); *H01S 5/141* (2013.01); *H01S 5/3401* (2013.01); *G01J 2003/423* (2013.01)

(58) Field of Classification Search
CPC .... G01J 3/42; G01J 2003/423; G02B 5/1814; H01S 5/141; H01S 5/3401
USPC .......................................................... 356/432
See application file for complete search history.

(56) References Cited

U.S. PATENT DOCUMENTS

| | | | |
|---|---|---|---|
| 7,903,704 B2 | 3/2011 | Patel et al. | |
| 2011/0299073 A1* | 12/2011 | Sakurai | ..................... G01J 3/10 356/319 |

* cited by examiner

*Primary Examiner* — Roy M Punnoose
(74) *Attorney, Agent, or Firm* — Faegre Drinker Biddle & Reath LLP

(57) ABSTRACT

A spectrum measurement apparatus includes a signal generation unit, a detector, an AD converter, and an operation unit. An external cavity laser light source includes a quantum cascade laser and a diffraction grating. The signal generation unit outputs a wavelength sweep signal repeatedly giving an instruction for sweep of a resonant wavelength selected by the diffraction grating and a pumping instruction signal repeatedly giving an instruction for on/off of pumping of the quantum cascade laser in each period of wavelength sweep based on the instruction of the wavelength sweep signal. The operation unit inputs a digital value output from the AD converter, obtains an oscillation spectrum in each period of the wavelength sweep, and integrates the oscillation spectra obtained with changing the phase of the pumping instruction signal for each period of the wavelength sweep.

14 Claims, 13 Drawing Sheets

SPECTRUM MEASUREMENT APPARATUS AND SPECTRUM MEASUREMENT METHOD

TECHNICAL FIELD

The present disclosure relates to an apparatus and a method that measure a spectrum of laser light output from a wavelength sweepable external cavity laser light source.

BACKGROUND

Patent Document 1 discloses an invention of a wavelength sweepable external cavity laser light source. The external cavity laser light source described in this document includes a quantum cascade laser as an optical amplification medium capable of generating broadband light by being pumped, a cavity for resonating light generated in the quantum cascade laser, and a reflection type diffraction grating for selecting a resonant wavelength in the cavity from the broadband. The diffraction grating is provided on one end of the cavity and has a variable tilt angle. The wavelength (resonant wavelength) of laser light output from the external cavity laser light source corresponds to the tilt angle of the diffraction grating.

In the wavelength sweepable external cavity laser light source, when the wavelength of the output laser light is swept by changing the tilt angle of the diffraction grating, and on/off of pumping of the optical amplification medium is repeated in the wavelength sweep period, a light pulse is output when the pumping is on, and the output wavelength thereof is discretely swept. FIG. 1 is a diagram illustrating an oscillation spectrum obtained by a single wavelength sweep in the wavelength sweepable external cavity laser light source. The horizontal axis in FIG. 1 corresponds to a wavelength or a wavenumber, and further corresponds to a time or the tilt angle of the diffraction grating. An analysis equivalent to Fourier transform infrared spectroscopy (FTIR) can be performed by using the wavelength sweepable external cavity laser light source.

In general, when an analysis is performed on various objects using a laser light source, it is necessary to make a comparison between a spectrum of laser light output from the laser light source before the laser light is applied to an analysis object and a spectrum of laser light reflected, transmitted, or scattered by the analysis object to which the laser light has been applied and output. Thus, it is important to measure the spectrum of laser light output from the laser light source (the laser light before being applied to the analysis object and the laser light reflected, transmitted, or scattered by the analysis object and output).

In order to obtain a spectrum of laser light output from the wavelength sweepable external cavity laser light source, it can be considered that a plurality of peak positions indicated in the oscillation spectrum of FIG. 1 are connected with a line in the order of wavelength. Further, it can also be considered that more peak positions are obtained by acquiring a plurality of oscillation spectra with shifting the phase of on/off of pumping of the optical amplification medium between a plurality of wavelength sweep periods, and these peak positions are connected with a line in the order of wavelength to obtain a smoother spectrum.

Patent Document 1: US Patent Publication No. 7903704

SUMMARY

The above method which obtains the spectrum by connecting a plurality of peak positions indicated in the oscillation spectrum with a line in the order of wavelength has the following problems. The pulse width of a light pulse which is output when the pumping is on is, for example, of the order of nanosecond and thus narrow, and thus, in order to correctly detect the peak position of the light pulse, it is necessary to AD-convert a signal output from a detector which receives the light pulse at high speed. However, it is difficult, or the cost of the measurement apparatus is increased.

Further, it becomes necessary to detect the peak position of the light pulse by signal processing, and an extremely large amount of data is handled. Thus, the signal processing requires a long time, and the cost of the measurement apparatus is increased also in this point.

In addition, the peak value of the light pulse may fluctuate from one pulse to another or from one wavelength sweep to another, and thus, the fluctuation may appear as noise in the spectrum.

An object of the present invention is to provide an apparatus and a method capable of measuring a spectrum of laser light output from a wavelength sweepable external cavity laser light source with high accuracy and at low cost.

An embodiment of the present invention is a spectrum measurement apparatus. The spectrum measurement apparatus is an apparatus for measuring a spectrum of laser light output from an external cavity laser light source including an optical amplification medium capable of generating broadband light by being pumped; a cavity configured to resonate light generated in the optical amplification medium; and a wavelength selection unit configured to select a resonant wavelength in the cavity from the broadband, and includes (1) a signal generation unit configured to generate and output a wavelength sweep signal repeatedly giving an instruction for sweep of the resonant wavelength selected by the wavelength selection unit and generate and output a pumping instruction signal repeatedly giving an instruction for on/off of pumping of the optical amplification medium in each period of wavelength sweep based on the instruction of the wavelength sweep signal, the signal generation unit being capable of adjusting a phase of the pumping instruction signal for each period of the wavelength sweep; (2) a detector configured to receive laser light output from the external cavity laser light source and output a detection signal indicating an intensity of the laser light; (3) an AD converter configured to repeatedly convert a value of the detection signal output from the detector to a digital value and output the digital value with a frequency higher than a frequency of repeating on/off of pumping of the optical amplification medium based on the instruction of the pumping instruction signal in each period of the wavelength sweep; and (4) an operation unit configured to obtain an oscillation spectrum on the basis of the digital value output from the AD converter in each period of the wavelength sweep and integrate the oscillation spectra obtained with changing the phase of the pumping instruction signal by the signal generation unit for each period of the wavelength sweep to obtain a spectrum of the laser light output from the external cavity laser light source.

An embodiment of the present invention is a spectrum measurement method. The spectrum measurement method is a method for measuring a spectrum of laser light output from an external cavity laser light source including an optical amplification medium capable of generating broadband light by being pumped; a cavity configured to resonate light generated in the optical amplification medium; and a wavelength selection unit configured to select a resonant wavelength in the cavity from the broadband, and includes, by using (1) a signal generation unit configured to generate and output a wavelength sweep signal repeatedly giving an instruction for sweep of the resonant wavelength selected by the wavelength selection unit and generate and output a pumping instruction signal repeatedly giving an instruction for on/off of pumping of the optical amplification medium in each period of wavelength sweep based on the instruction of the wavelength sweep signal, the signal generation unit being capable of adjusting a phase of the pumping instruction signal for each period of the wavelength sweep, (2) a detector configured to receive laser light output from the external cavity laser light source and output a detection signal indicating an intensity of the laser light, and (3) an AD converter configured to repeatedly convert a value of the detection signal output from the detector to a digital value and output the digital value with a frequency higher than a frequency of repeating on/off of pumping of the optical amplification medium based on the instruction of the pumping instruction signal in each period of the wavelength sweep, obtaining an oscillation spectrum on the basis of the digital value output from the AD converter in each period of the wavelength sweep and integrating the oscillation spectra obtained with changing the phase of the pumping instruction signal by the signal generation unit for each period of the wavelength sweep to obtain a spectrum of the laser light output from the external cavity laser light source.

According to the embodiments of the present invention, it is possible to measure a spectrum of laser light output from a wavelength sweepable external cavity laser light source with high accuracy and at low cost.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION

Hereinafter, embodiments of a spectrum measurement apparatus and a spectrum measurement method will be described in detail with reference to the accompanying drawings. In the description of the drawings, the same elements will be denoted by the same reference signs, without redundant description. Further, the present invention is not limited to these examples.

Figure 2:
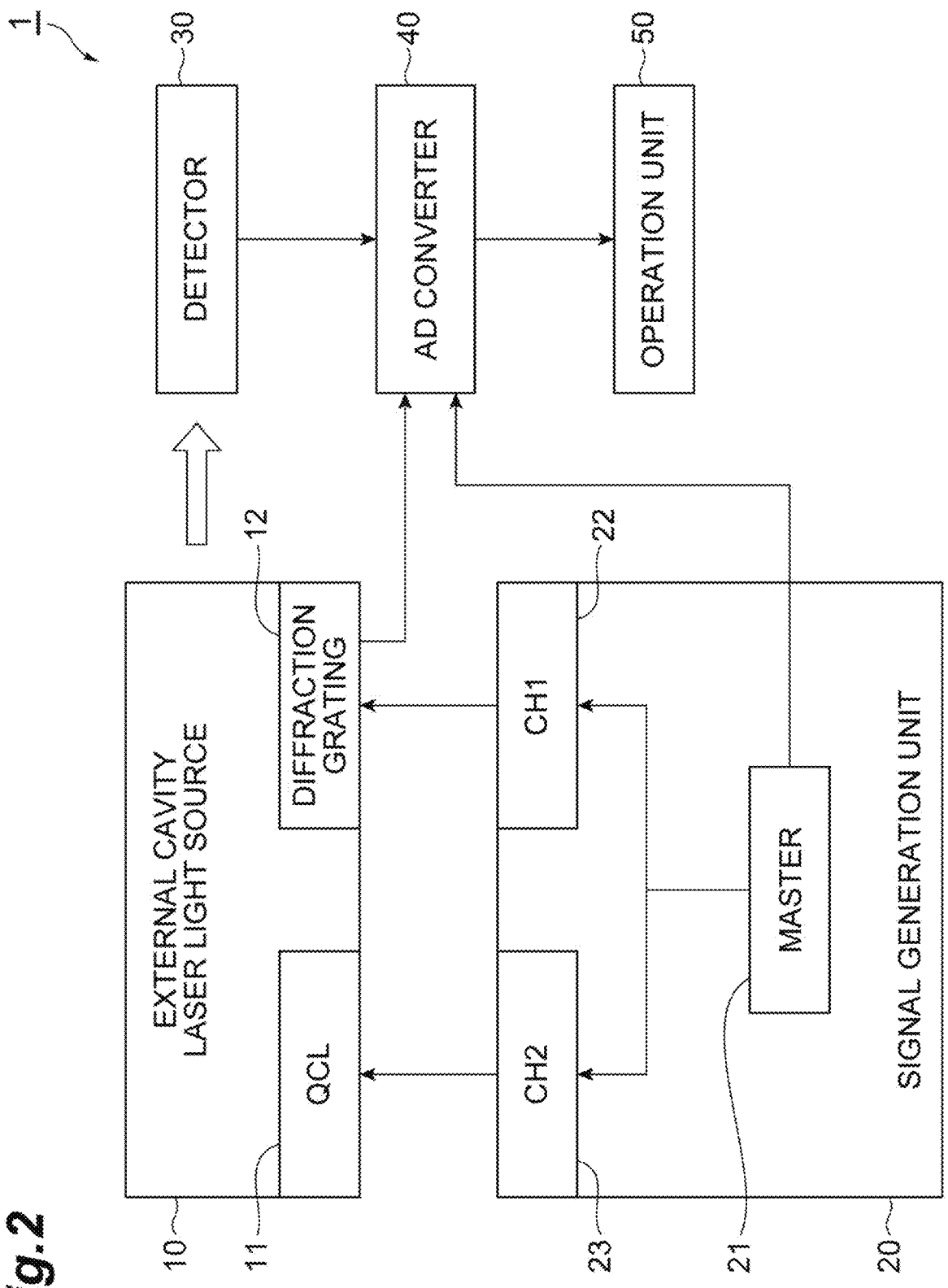
FIG. 2 is a diagram illustrating a configuration of a spectrum measurement apparatus.
Figure 3:
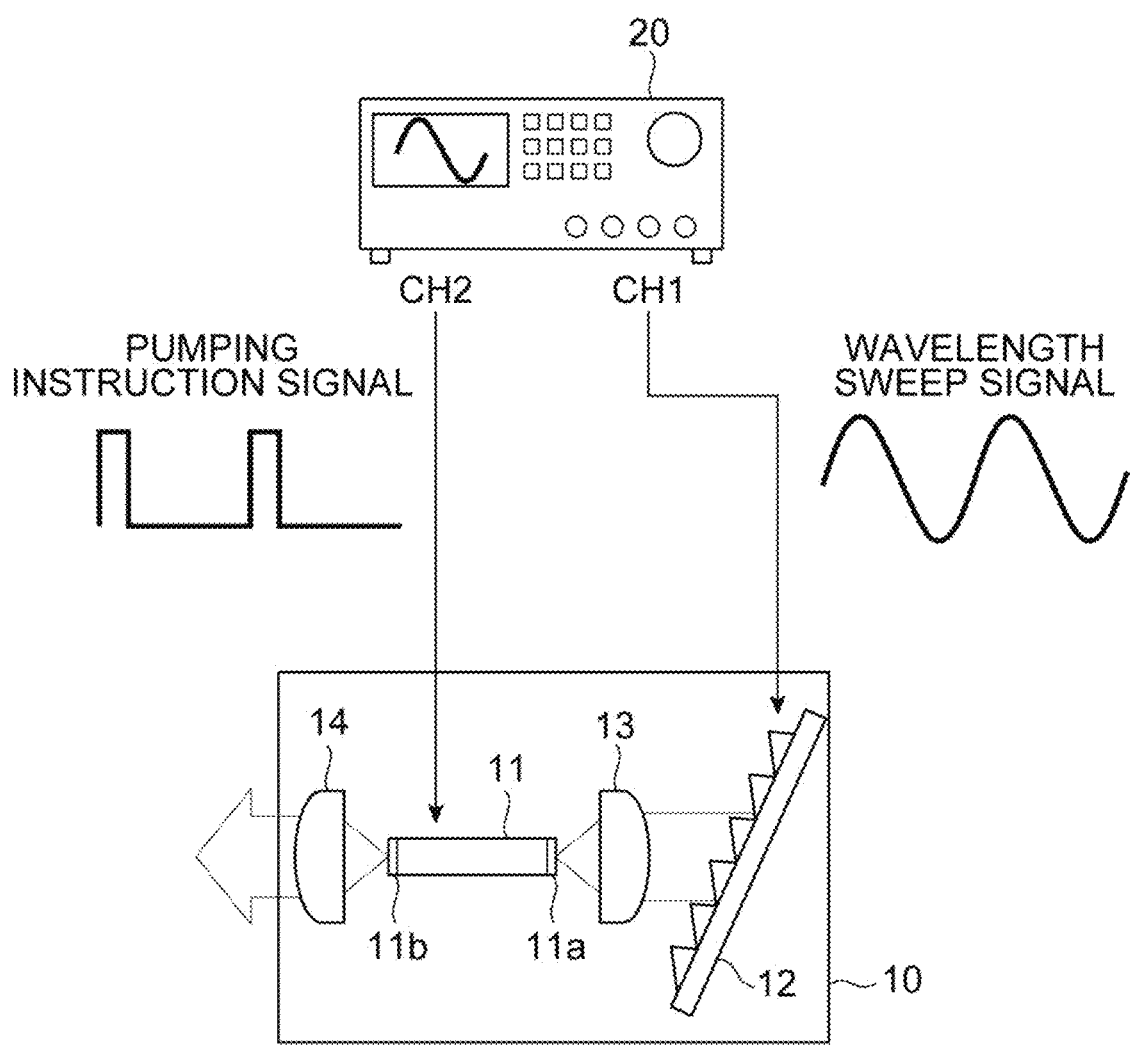
FIG. 3 is a diagram illustrating a configuration of an external cavity laser light source.

FIG. 2 is a diagram illustrating a configuration of a spectrum measurement apparatus 1. The spectrum measurement apparatus 1 is an apparatus for measuring a spectrum of laser light output from an external cavity laser light source 10, and includes a signal generation unit 20, a detector 30, an AD converter 40, and an operation unit 50. FIG. 3 is a diagram illustrating a configuration of the external cavity laser light source 10. FIG. 3 also illustrates the signal generation unit 20. Hereinafter, the configuration of the external cavity laser light source 10 and the configuration of the spectrum measurement apparatus 1 will be described with reference to FIG. 2 and FIG. 3.

As illustrated in FIG. 3, the external cavity laser light source 10 includes a quantum cascade laser 11, a diffraction grating 12, a lens 13, and a lens 14. The quantum cascade laser 11 is an optical amplification medium which is capable of generating broadband light by being pumped. The quantum cascade laser 11 has a structure in which well layers and barrier layers are alternately formed, and can achieve a desired emission band (for example, a mid-infrared band) by appropriately designing the thicknesses of respective layers.

An end face 11a of the lens 13 side, being one of the two opposed end faces of the quantum cascade laser 11, is provided with a reflection reducing film, and capable of inputting and outputting light with high transmittance. The lens 13 collimates light diverged and output to the outside from the end face 11a of the quantum cascade laser 11 and allows the light to enter the diffraction grating 12. Further, the lens 13 converges light arrived from the diffraction grating 12 and allows the light to enter the end face 11a of the quantum cascade laser 11.

The diffraction grating 12 is a reflection type diffraction grating having a variable tilt angle, and feeds light of a specific wavelength in the light output from the end face 11a of the quantum cascade laser 11 back to the end face 11a of the quantum cascade laser 11. The diffraction grating 12 is capable of feeding back light of the wavelength corresponding to the tilt angle thereof. The diffraction grating 12 is preferably a MEMS (Micro Electro Mechanical Systems) device, which enables high-speed wavelength sweep.

An end face 11b of the lens 14 side, being one of the two opposed end faces of the quantum cascade laser 11, reflects a part of light and transmits the rest part thereof. The end face 11b and the diffraction grating 12 constitute an external cavity. The diffraction grating 12 is provided on one end of the cavity. The diffraction grating 12 is a wavelength selection unit which selects a resonant wavelength in the cavity from the light generated in the quantum cascade laser 11. The cavity resonates light of a wavelength corresponding to the tilt angle of the diffraction grating 12 in the light generated in the quantum cascade laser 11. The light of the resonant wavelength is output as laser light from the end face 11b and collimated by the lens 14.

The signal generation unit 20 generates and outputs a wavelength sweep signal repeatedly giving an instruction for sweep of the resonant wavelength selected by the diffraction grating 12. The signal generation unit 20 generates and outputs a pumping instruction signal repeatedly giving an instruction for on/off of pumping of the quantum cascade laser 11 in each period of wavelength sweep based on the instruction of the wavelength sweep signal. The signal generation unit 20 is capable of adjusting the phase of the pumping instruction signal for each period of the wavelength sweep.

In order to facilitate signal generation, the signal generation unit 20 preferably frequency-divides a reference clock having a constant period $T_0$ to generate the wavelength sweep signal having a constant period $T_1$ ($=T_0/m$), and further, preferably frequency-divides the reference clock or the wavelength sweep signal to generate the pumping instruction signal having a constant period $T_2$ ($=T_1/n$). Here, m, n are integers of 2 or more. For example, n=100, the wavelength sweep signal is a sine wave having a frequency of 1.8 kHz, and the pumping instruction signal is a rectangular wave having a frequency of 180 kHz. The pumping is off in a period when the pumping instruction signal is at a low level (for example, 0 V), and the pumping is on in a period when the pumping instruction signal is at a high level (for example, 4 V). The duty of the pumping instruction signal is several %.

As illustrated in FIG. 2, the signal generation unit 20 includes a reference clock generation unit 21, a wavelength sweep signal generation unit 22, and a pumping instruction signal generation unit 23. The reference clock generation unit 21 generates and outputs the reference clock. The wavelength sweep signal generation unit 22 generates the wavelength sweep signal by frequency-dividing the reference clock and outputs the generated signal to the diffraction grating 12. The pumping instruction signal generation unit 23 generates the pumping instruction signal by frequency-dividing the reference clock or the wavelength sweep signal and outputs the generated signal to the quantum cascade laser 11.

The detector 30 receives light collimated and output from the lens 14 of the external cavity laser light source 10, and outputs a detection signal indicating the intensity of the laser light to the AD converter 40. In the case where the laser light is mid-infrared light, an MCT (HgCdTe) detector or an InAsSb detector is preferably used as the detector 30.

The AD converter 40 converts (AD-converts) a value of the detection signal output from the detector 30 to a digital value, and outputs the digital value to the operation unit 50. The AD conversion in the AD converter 40 is repeatedly performed with a frequency higher than the frequency of repeating on/off of pumping of the quantum cascade laser 11 based on the instruction of the pumping instruction signal in each period of the wavelength sweep. The AD conversion in the AD converter 40 is repeatedly performed at the timing indicated by the reference clock output from the reference clock generation unit 21 of the signal generation unit 20 (or a clock generated by frequency-dividing the reference clock). The AD converter 40 may be, for example, an oscilloscope.

The operation unit 50 inputs the digital value output from the AD converter 40, and obtains an oscillation spectrum (FIG. 1) in each period of the wavelength sweep. The operation unit 50 integrates the oscillation spectra obtained with changing the phase of the pumping instruction signal by the signal generation unit 20 for each period of the wavelength sweep to obtain the spectrum of the laser light output from the external cavity laser light source 10. The operation unit 50 is, for example, a computer.

Preferably, the AD converter 40 inputs a measured value of the tilt angle of the diffraction grating 12, converts the measured value to a digital value, and outputs the digital value to the operation unit 50. The digital value indicates more accurate wavelength information, and thus, the operation unit 50 can obtain a more accurate oscillation spectrum using the wavelength information indicated by the digital value. Further, a drift of the wavelength sweep can be successively corrected by feedback by using the wavelength information indicated by the digital value.

Figure 1:
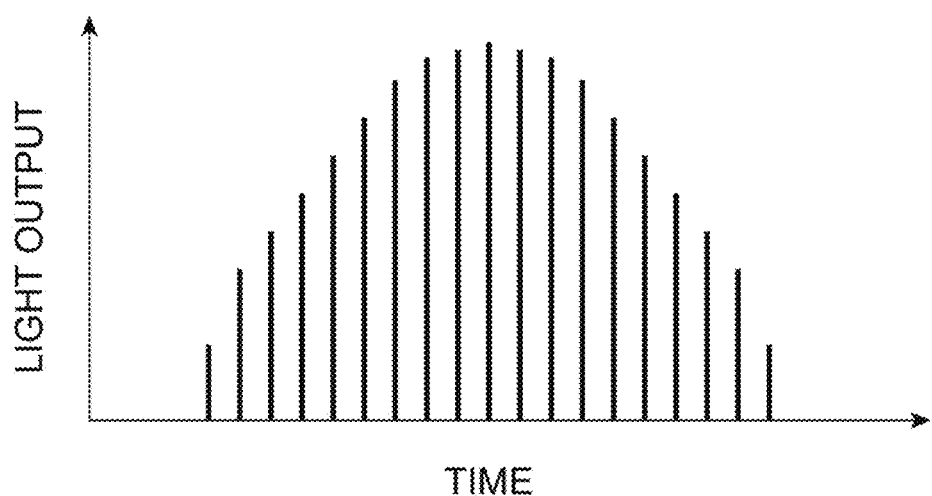
FIG. 1 is a diagram illustrating an oscillation spectrum obtained by a single wavelength sweep in a wavelength sweepable external cavity laser light source.
Figure 4:
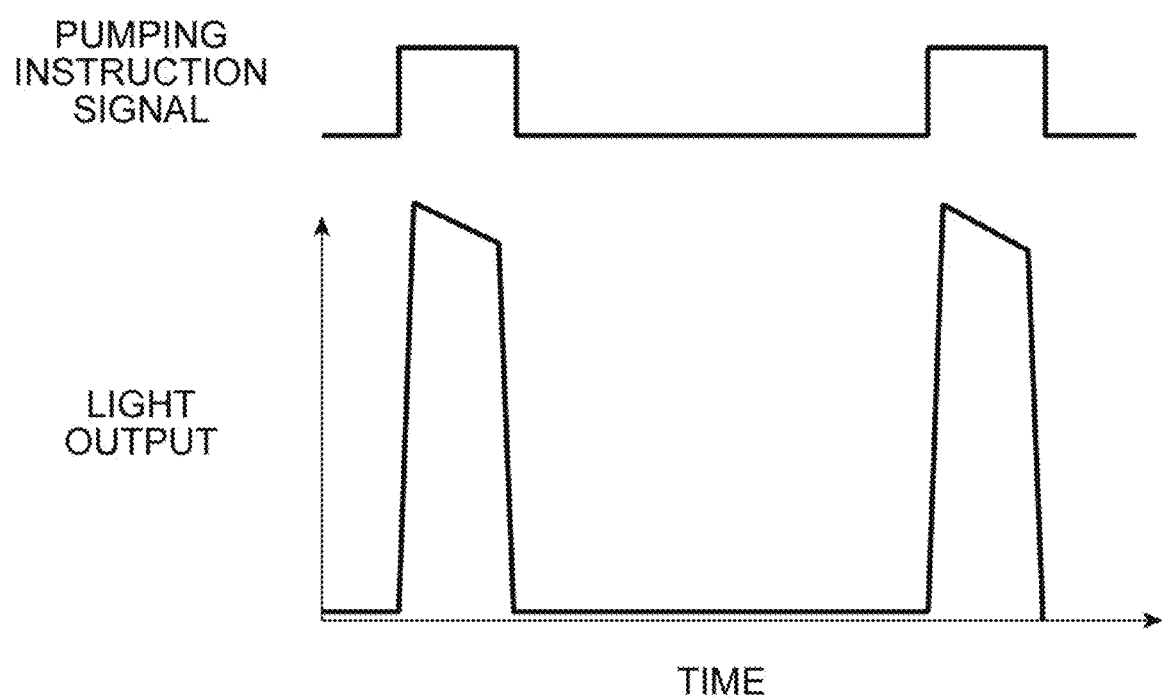
FIG. 4 is a diagram illustrating a part of the oscillation spectrum of FIG. 1 in an enlarged manner.

FIG. 4 is a diagram illustrating a part of the oscillation spectrum of FIG. 1 in an enlarged manner. FIG. 4 illustrates two periods when the pumping instruction signal is at a high level and the pumping is on. As illustrated in FIG. 4, a light pulse is output from the external cavity laser light source 10 in each of the periods when the pumping is on.

Figure 5:
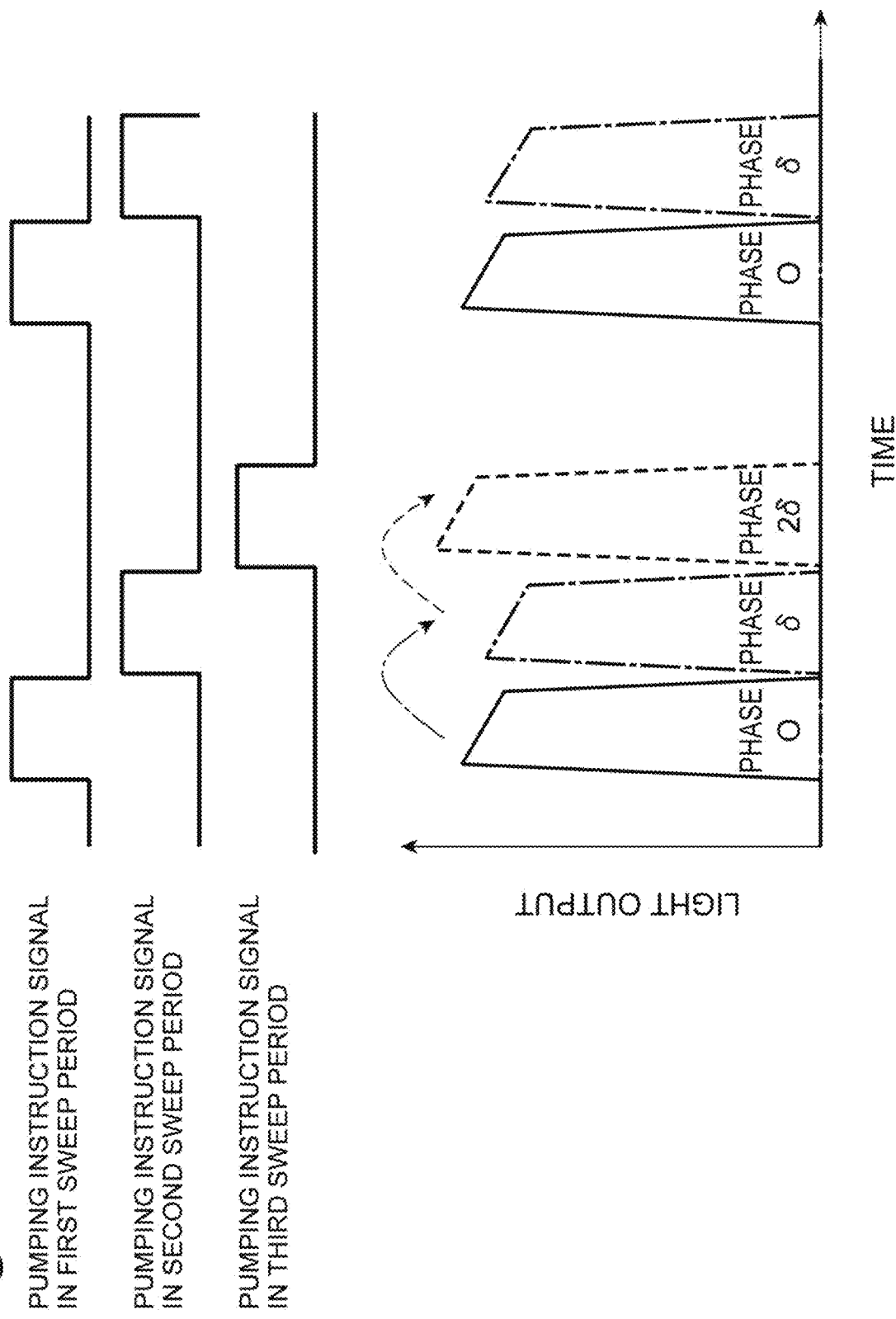
FIG. 5 is a diagram describing a method of obtaining a spectrum of laser light output from the external cavity laser light source according to a comparative example.
Figure 6:
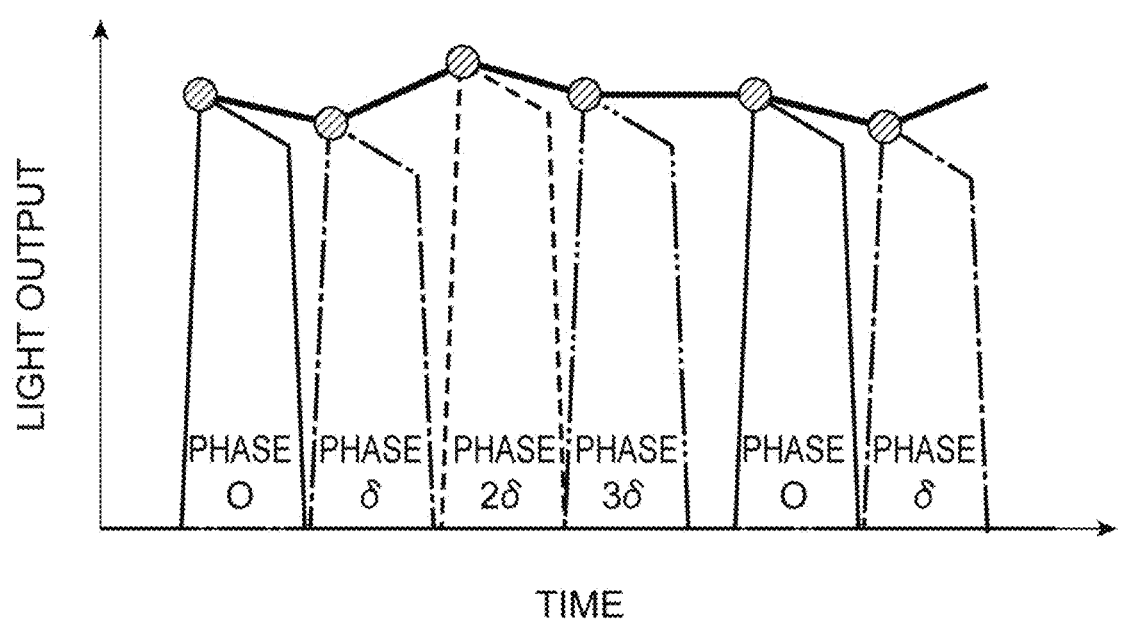
FIG. 6 is a diagram describing a method of obtaining a spectrum of laser light output from the external cavity laser light source according to the comparative example.

FIG. 5 and FIG. 6 are diagrams describing a method of obtaining a spectrum of laser light output from the external cavity laser light source 10 according to a comparative example. FIG. 5 and FIG. 6 also illustrate a part of the oscillation spectrum in an enlarged manner. In the comparative example, the phase of the pumping instruction signal is changed to 0, δ, 2δ, 3δ, and so on for each period of the wavelength sweep, and the oscillation spectrum is obtained for each phase (FIG. 5). Then, peak positions of all of these oscillation spectra are obtained, and the peak positions are connected with a line in the order of wavelength to obtain the spectrum of the laser light output from the external cavity laser light source 10 (FIG. 6). Here, a phase change step (unit of phase change) δ of the pumping instruction signal for each period of the wavelength sweep may correspond to a time of 1/integer of the period $T_2$ of the pumping instruction signal.

In FIG. 5 and FIG. 6, the oscillation spectrum in a first sweep period when the phase of the pumping instruction signal is zero (reference phase) is indicated by a solid line. The oscillation spectrum in a second sweep period when the phase of the pumping instruction signal is δ is indicated by a dot-dashed line. The oscillation spectrum in a third sweep period when the phase of the pumping instruction signal is 2δ is indicated by a dashed line. Further, the oscillation spectrum in a fourth sweep period when the phase of the pumping instruction signal is 3δ is indicated by a dot-dot-dashed line.

However, the method of the comparative example has the problems described above. On the other hand, a method of obtaining the spectrum of the laser light output from the external cavity laser light source 10 according to the present embodiment described below can solve the problems in the method of the comparative example. In the present embodiment, the operation unit 50 integrates the oscillation spectra (FIG. 5) obtained with changing the phase of the pumping instruction signal by the signal generation unit 20 for each period of the wavelength sweep to obtain the spectrum of the laser light output from the external cavity laser light source 10. Hereinafter, the spectrum obtained in this manner is referred to as the "integrated spectrum".

Figure 7:
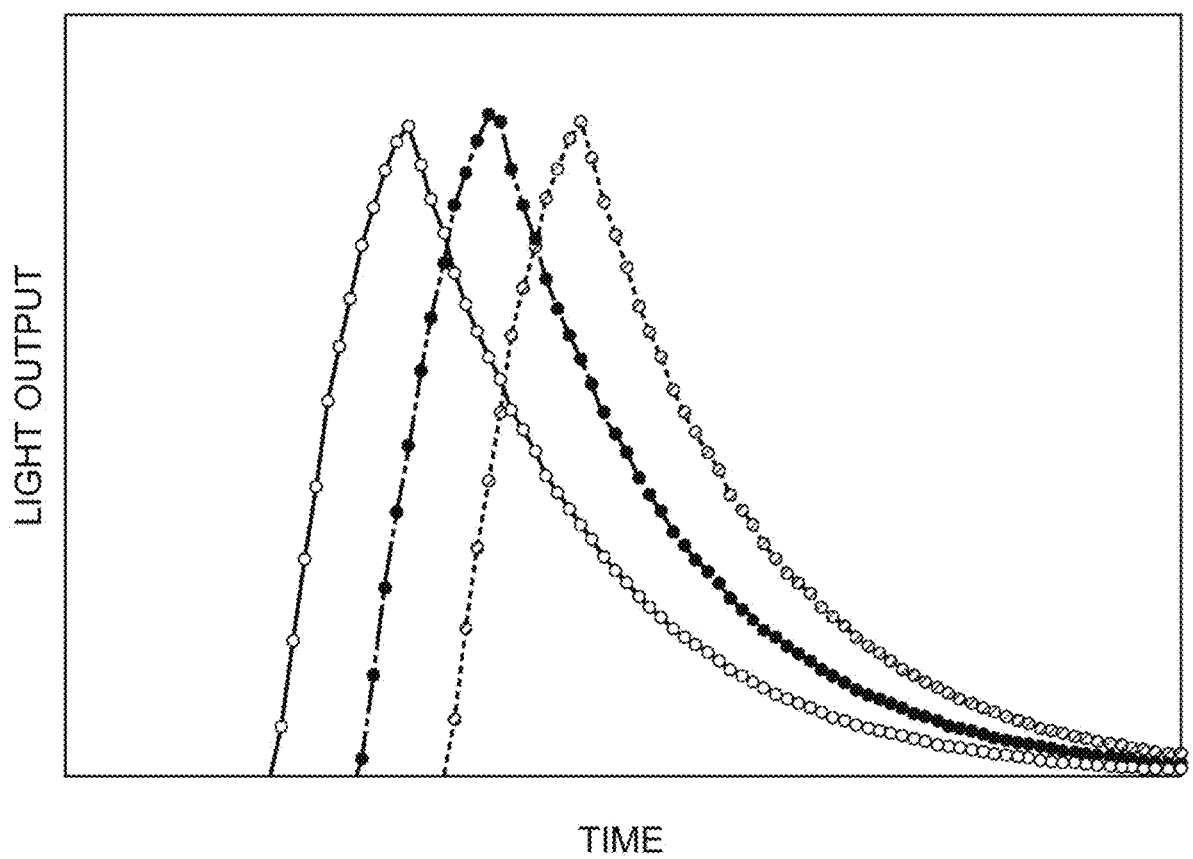
FIG. 7 is a diagram illustrating a waveform example of a detection signal output from a detector which receives a light pulse and input to an AD converter.

FIG. 7 is a diagram illustrating a waveform example of the detection signal output from the detector 30 which receives the light pulse and input to the AD converter 40. A value of the detection signal which is output from the detector 30 and input to the AD converter 40 rapidly increases from a certain time, reaches its peak, and then gradually decreases and trails in practice as illustrated in FIG. 7. Thus, when oscillation spectra are acquired with changing the phase of the pumping instruction signal for each period of the wavelength sweep, a certain pulse of one of the oscillation spectra and a certain pulse of another one of the oscillation spectra can be made at least partially overlap each other.

FIG. 7 illustrates three oscillation spectra obtained with changing the phase change step δ of the pumping instruction signal for each period of the wavelength pump by 20 deg (386 ns) each time, and pulses of the respective oscillation spectra at least partially overlap each other. In the present embodiment, by using this, the oscillation spectra obtained with changing the phase of the pumping instruction signal by the signal generation unit 20 for each period of the wavelength sweep are integrated to obtain the integrated spectrum.

Figure 8:
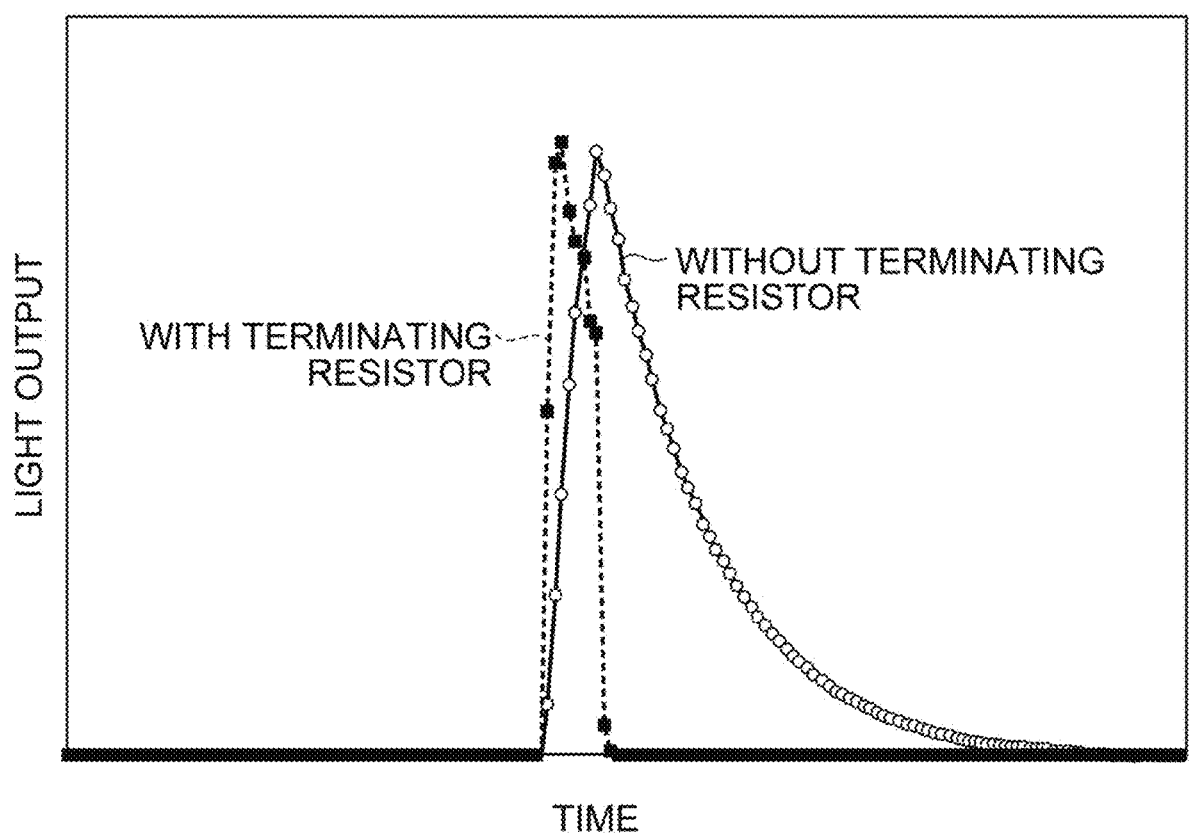
FIG. 8 is a diagram illustrating a waveform example of the detection signal output from the detector which receives the light pulse and input to the AD converter (in each of the cases without and with a terminating resistor).

FIG. 8 is a diagram illustrating a waveform example of the detection signal output from the detector 30 which receives the light pulse and input to the AD converter 40 (in each of the cases without and with a terminating resistor). In the case where a terminating resistor is provided on an input terminal of the AD converter 40, the detector functions as a detector having a high response speed, for example, having rise and fall of 50 ns or less, and the rise time of each pulse of the oscillation spectrum is short and the tail after the peak is short.

On the other hand, in the case where no terminating resistor is provided on the input terminal of the AD converter 40, the detector functions as a detector having a low response speed, for example, having rise and fall of 50 ns or more, and the rise time of each pulse of the oscillation spectrum is long and the tail after the peak is long. Thus, in obtaining the integrated spectrum in the present embodiment, it is preferred that no terminating resistor is provided on the input terminal of the AD converter 40. This makes it possible to obtain an integrated spectrum having an excellent S/N ratio with a small number of integrations.

Figure 9:
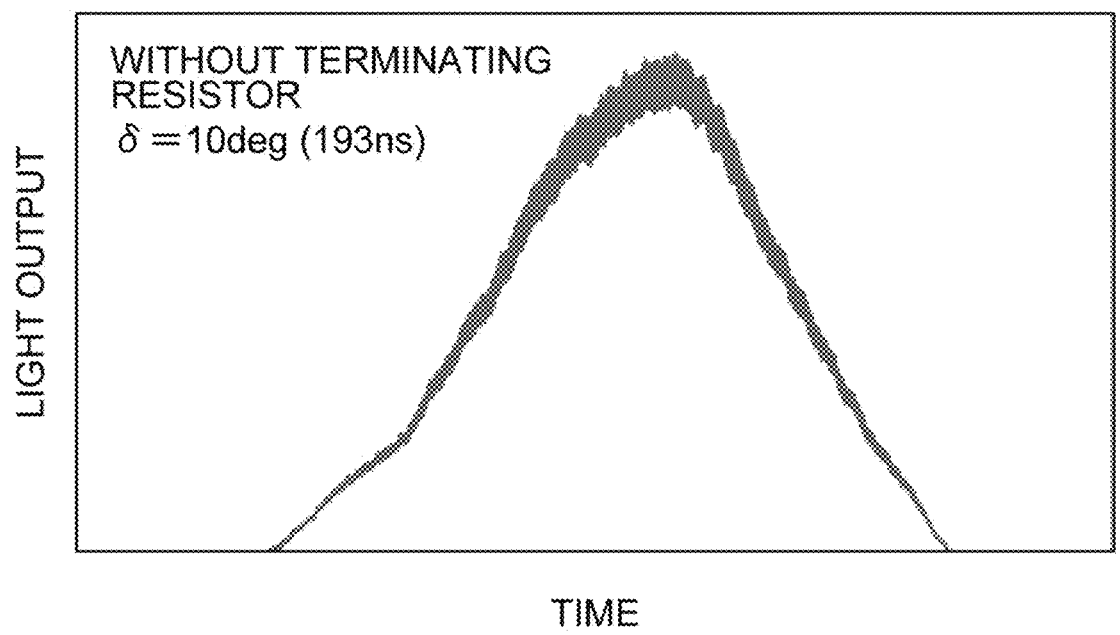
FIG. 9 is a diagram illustrating an example of an integrated spectrum.
Figure 10:
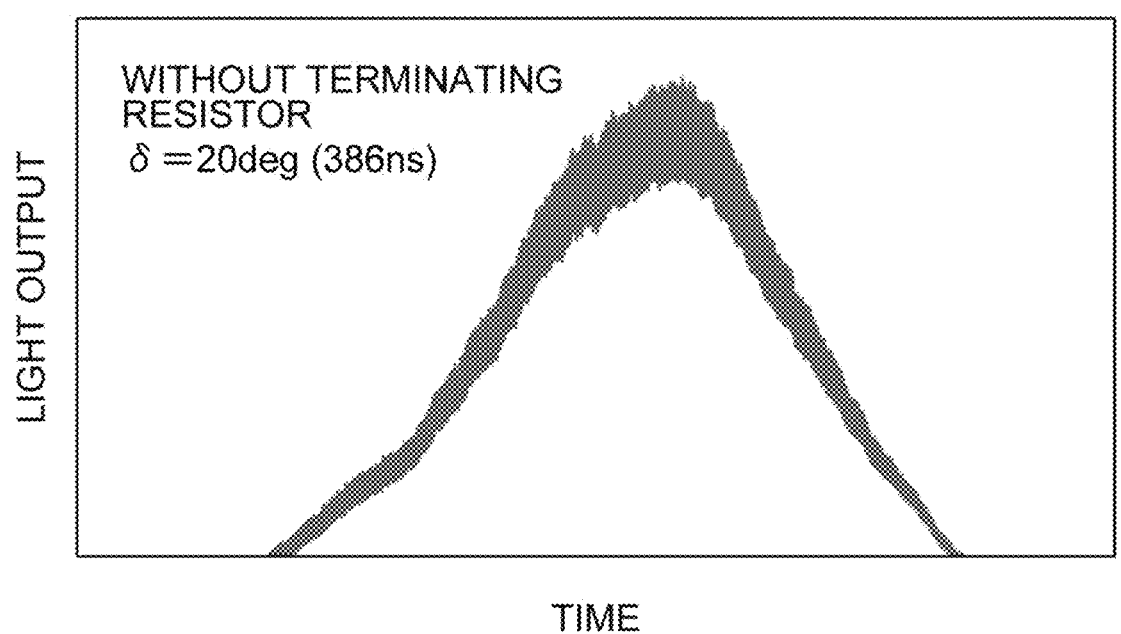
FIG. 10 is a diagram illustrating an example of the integrated spectrum.
Figure 11:
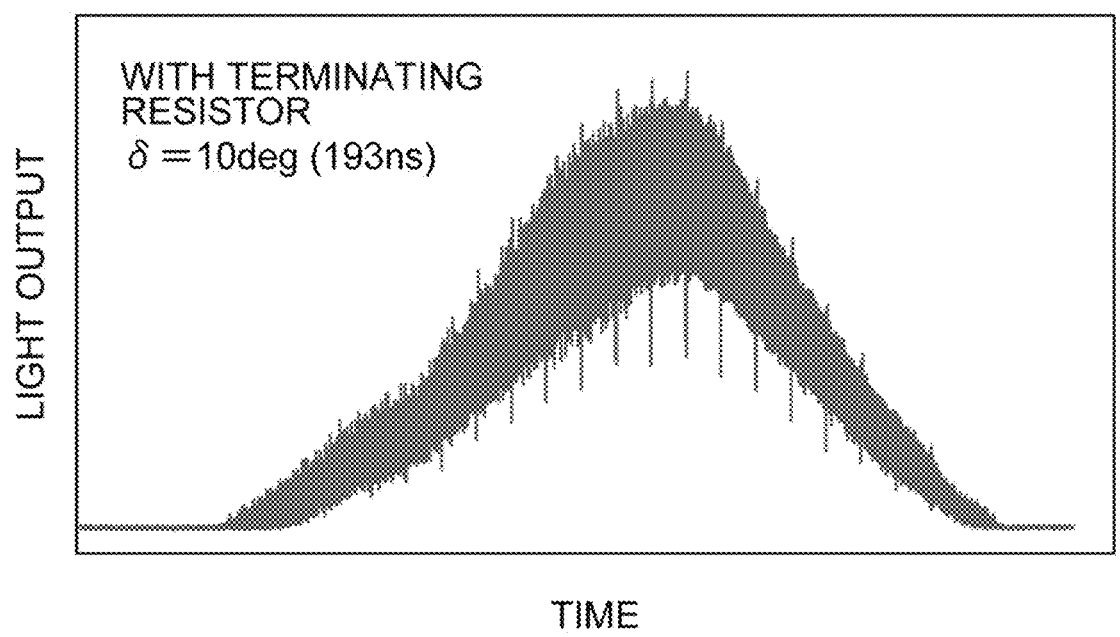
FIG. 11 is a diagram illustrating an example of the integrated spectrum.

FIG. 9 to FIG. 11 are diagrams illustrating examples of the integrated spectrum. FIG. 9 illustrates an integrated spectrum obtained from 36 oscillation spectra on the conditions that no terminating resistor is provided and δ=10 deg (193 ns). FIG. 10 illustrates an integrated spectrum obtained from 18 oscillation spectra on the conditions that no terminating resistor is provided and δ=20 deg (386 ns). FIG. 11 illustrates an integrated spectrum obtained from 36 oscillation spectra on the conditions that a terminating resistor is provided and δ=10 deg (193 ns).

As can be understood from the comparison between FIG. 9 to FIG. 11, with the same phase change step δ of the pumping instruction signal for each period of the wavelength sweep, a better S/N ratio can be obtained in the integrated spectrum in the case without a terminating resistor (FIG. 9) than in the integrated spectrum in the case with a terminating resistor (FIG. 11). Further, in the case without a terminating resistor, a better S/N ratio can be obtained in the integrated spectrum in the case where the phase change step δ is small (FIG. 9) than in the integrated spectrum in the case where the phase change step δ is large (FIG. 10).

Figure 12:
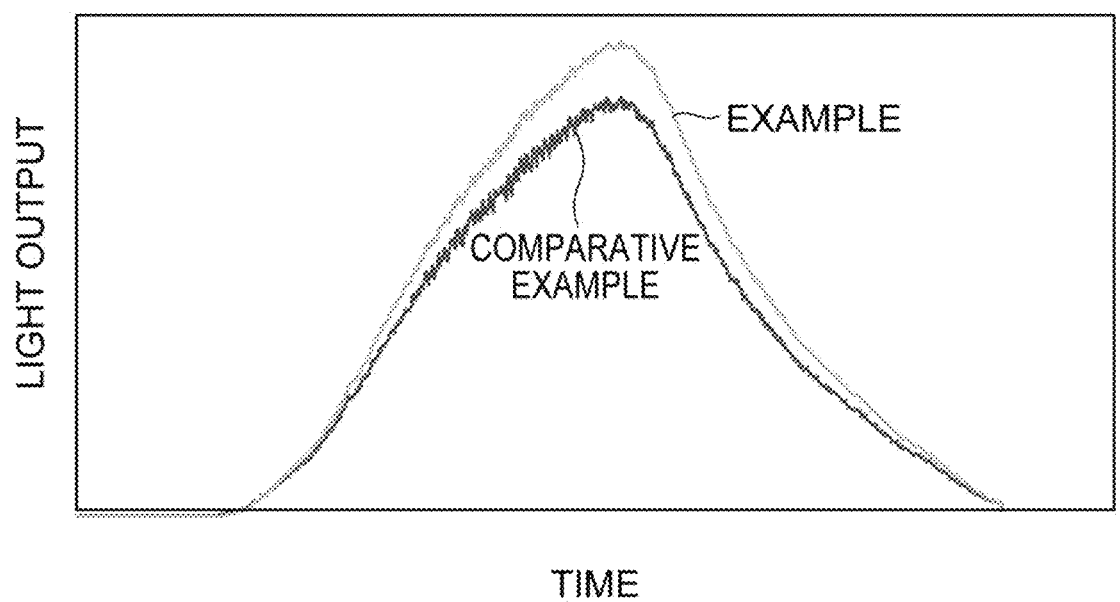
FIG. 12 is a diagram illustrating integrated spectra obtained in an example and a comparative example.

FIG. 12 is a diagram illustrating integrated spectra obtained in an example and a comparative example. Here, the integrated spectra obtained in the case where no terminating resistor is provided on the input terminal of the AD converter 40 are illustrated. The phase change step δ of the pumping instruction signal for each period of the wavelength sweep is set to 5 deg (26 ns). As illustrated in FIG. 12, the S/N ratio of the integrated spectrum in the example is better than that in the comparative example.

Figure 13:
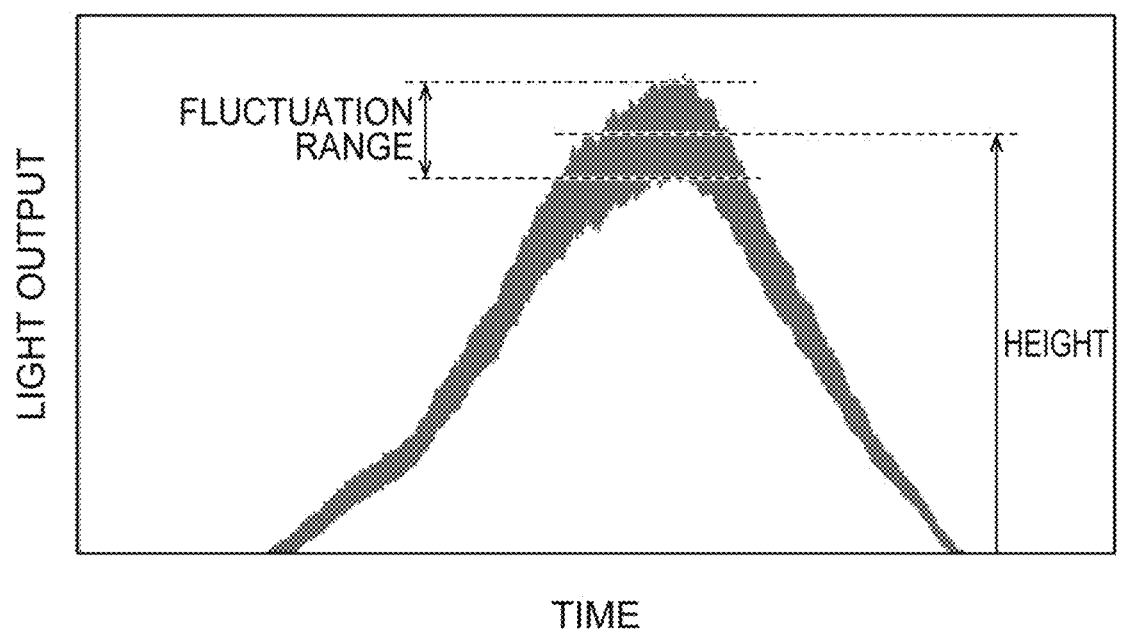
FIG. 13 is a diagram describing the integration of oscillation spectra by an integration unit.

The operation unit 50 may perform the integration of oscillation spectra a certain number of times. Preferably, as illustrated in FIG. 13, the operation unit 50 performs the integration of oscillation spectra until a ratio of a fluctuation range to a height of a center line in the spectrum shape of the integration result becomes smaller than a predetermined threshold value.

For example, (360/δ) oscillation spectra are acquired with shifting the phase of the pumping instruction signal by δ (deg) for each period of the wavelength sweep, and the acquired spectra are integrated. When the ratio of the fluctuation range to the height of the center line in the spectrum shape of the integration result is larger than the predetermined threshold value, (360/δ) oscillation spectra are acquired again with shifting the phase of the pumping instruction signal by δ (deg) for each period of the wavelength sweep, and the acquired spectra are further integrated with the former integration result.

Such a repetitive operation is performed until the ratio of the fluctuation range to the height of the center line in the spectrum shape of the integration result becomes smaller than the predetermined threshold value. This makes it possible to obtain an integrated spectrum having a desired S/N ratio.

One aspect of the present invention is the spectrum measurement apparatus 1 of the above embodiment, and further, another aspect of the present invention is a spectrum measurement method. The spectrum measurement method of the present embodiment is a method for measuring the spectrum of the laser light output from the external cavity laser light source 10.

The spectrum measurement method of the present embodiment, by using the signal generation unit 20, the detector 30, and the AD converter 40, obtains the oscillation spectrum on the basis of the digital value output from the AD converter 40 in each period of wavelength sweep, and integrates the oscillation spectra obtained by changing the phase of the pumping instruction signal by the signal generation unit 20 for each period of the wavelength sweep to obtain the spectrum (integrated spectrum) of the laser light output from the external cavity laser light source 10.

In the present embodiment, it is not necessary to detect the peak position of the light pulse, and it is possible to obtain the integrated spectrum merely by integrating the oscillation spectra obtained with changing the phase of the pumping instruction signal for each period of the wavelength sweep. Thus, the time required for signal processing is shortened, the requirement for processing speed in AD-converting the signal output from the detector is relaxed, and the integrated spectrum can be obtained with a low-cost apparatus configuration. Further, since the integrated spectrum is obtained by integrating a plurality of oscillation spectra, even when the peak value of the light pulse fluctuates from one pulse to another or from one wavelength sweep to another, the integrated spectrum with high accuracy can be obtained.

The spectrum measurement apparatus and the spectrum measurement method are not limited to the embodiments and configuration examples described above, and can be variously modified. For example, in the external cavity laser light source, the optical amplification medium capable of generating broadband light by being pumped is not limited to the quantum cascade laser, and may be any other medium. The wavelength selection unit which selects the resonant wavelength in the cavity is not limited to the reflection type diffraction grating, and may have a configuration including a transmission type diffraction grating or a configuration including a prism.

The spectrum measurement apparatus of the above embodiment is an apparatus for measuring a spectrum of laser light output from an external cavity laser light source including an optical amplification medium capable of generating broadband light by being pumped; a cavity configured to resonate the light generated in the optical amplification medium; and a wavelength selection unit configured to select a resonant wavelength in the cavity from the broadband, and includes (1) a signal generation unit configured to generate and output a wavelength sweep signal repeatedly giving an instruction for sweep of the resonant wavelength selected by the wavelength selection unit and generate and output a pumping instruction signal repeatedly giving an instruction for on/off of pumping of the optical amplification medium in each period of wavelength sweep based on the instruction of the wavelength sweep signal, the signal generation unit being capable of adjusting a phase of the pumping instruction signal for each period of the wavelength sweep; (2) a detector configured to receive laser light output from the external cavity laser light source and output a detection signal indicating an intensity of the laser light; (3) an AD converter configured to repeatedly convert a value of the detection signal output from the detector to a digital value and output the digital value with a frequency higher than a frequency of repeating on/off of pumping of the optical amplification medium based on the instruction of the pumping instruction signal in each period of the wavelength sweep; and (4) an operation unit configured to obtain an oscillation spectrum on the basis of the digital value output from the AD converter in each period of the wavelength sweep and integrate the oscillation spectra obtained with changing the phase of the pumping instruction signal by the signal generation unit for each period of the wavelength sweep to obtain a spectrum of the laser light output from the external cavity laser light source.

The spectrum measurement method of the above embodiment is a method for measuring a spectrum of laser light output from the external cavity laser light source having the above configuration, and includes, by using the signal generation unit, the detector, and the AD converter described above, obtaining an oscillation spectrum on the basis of the digital value output from the AD converter in each period of the wavelength sweep and integrating the oscillation spectra obtained with changing the phase of the pumping instruction signal by the signal generation unit for each period of the wavelength sweep to obtain a spectrum of the laser light output from the external cavity laser light source.

In the above configuration, the signal generation unit may be configured to generate the wavelength sweep signal on the basis of a reference clock having a constant period, generate the pumping instruction signal having a period being 1/integer of a period of the wavelength sweep signal, and adjust the phase of the pumping instruction signal with a unit of a phase corresponding to a time of 1/integer of the period of the pumping instruction signal.

The detector is desirably a combination of a fast response detector, such as an MCT (HgCdTe) device or an InGaSb device, and an amplifier with a slow response, and has a low response speed, for example, has rise and fall of 50 ns or more, and (rise time+fall time) preferably coincides with the period of the pumping instruction signal.

In the above configuration, no terminating resistor may be provided on an input terminal of the AD converter. Further, in the above configuration, the operation unit may be configured to perform the integration of the oscillation spectra until a ratio of a fluctuation range to a height of a center line in a spectrum shape of the integration result becomes smaller than a predetermined threshold value.

As to the external cavity laser light source in the above configuration, the optical amplification medium may be a quantum cascade laser.

In the above configuration, the wavelength selection unit may be a reflection type diffraction grating provided on one end of the cavity and having a variable tilt angle, and be configured to select the resonant wavelength corresponding to the tilt angle of the diffraction grating. Further, in the above configuration, the diffraction grating may be a MEMS device.

The present invention is usable as an apparatus and a method capable of measuring a spectrum of laser light output from a wavelength sweepable external cavity laser light source with high accuracy and at low cost.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A spectrum measurement apparatus for measuring a spectrum of laser light output from an external cavity laser light source including an optical amplification medium capable of generating broadband light by being pumped; a cavity configured to resonate the light generated in the optical amplification medium; and a wavelength selection unit configured to select a resonant wavelength in the cavity from the broadband, the apparatus comprising:
a signal generation unit configured to generate and output a wavelength sweep signal repeatedly giving an instruction for sweep of the resonant wavelength selected by the wavelength selection unit and generate and output a pumping instruction signal repeatedly giving an instruction for on/off of pumping of the optical amplification medium in each period of wavelength sweep based on the instruction of the wavelength sweep signal, the signal generation unit being capable of adjusting a phase of the pumping instruction signal for each period of the wavelength sweep;
a detector configured to receive laser light output from the external cavity laser light source and output a detection signal indicating an intensity of the laser light;
an AD converter configured to repeatedly convert a value of the detection signal output from the detector to a digital value and output the digital value with a frequency higher than a frequency of repeating on/off of pumping of the optical amplification medium based on the instruction of the pumping instruction signal in each period of the wavelength sweep; and
an operation unit configured to obtain an oscillation spectrum on the basis of the digital value output from the AD converter in each period of the wavelength sweep and integrate the oscillation spectra obtained with changing the phase of the pumping instruction signal by the signal generation unit for each period of the wavelength sweep to obtain a spectrum of the laser light output from the external cavity laser light source.

2. The spectrum measurement apparatus according to claim 1, wherein the signal generation unit is configured to generate the wavelength sweep signal on the basis of a reference clock having a constant period, generate the pumping instruction signal having a period being 1/integer of a period of the wavelength sweep signal, and adjust the phase of the pumping instruction signal with a unit of a phase corresponding to a time of 1/integer of the period of the pumping instruction signal.

3. The spectrum measurement apparatus according to claim 1, wherein no terminating resistor is provided on an input terminal of the AD converter.

4. The spectrum measurement apparatus according to claim 1, wherein the operation unit is configured to perform the integration of the oscillation spectra until a ratio of a fluctuation range to a height of a center line in a spectrum shape of the integration result becomes smaller than a predetermined threshold value.

5. The spectrum measurement apparatus according to claim 1, wherein the optical amplification medium is a quantum cascade laser.

6. The spectrum measurement apparatus according to claim 1, wherein the wavelength selection unit is a reflection type diffraction grating provided on one end of the cavity and having a variable tilt angle, and is configured to select the resonant wavelength corresponding to the tilt angle of the diffraction grating.

7. The spectrum measurement apparatus according to claim 6, wherein the diffraction grating is a MEMS device.

8. A spectrum measurement method for measuring a spectrum of laser light output from an external cavity laser light source including an optical amplification medium capable of generating broadband light by being pumped; a cavity configured to resonate the light generated in the optical amplification medium; and a wavelength selection unit configured to select a resonant wavelength in the cavity from the broadband, the method comprising:

by using
a signal generation unit configured to generate and output a wavelength sweep signal repeatedly giving an instruction for sweep of the resonant wavelength selected by the wavelength selection unit and generate and output a pumping instruction signal repeatedly giving an instruction for on/off of pumping of the optical amplification medium in each period of wavelength sweep based on the instruction of the wavelength sweep signal, the signal generation unit being capable of adjusting a phase of the pumping instruction signal for each period of the wavelength sweep, a detector configured to receive laser light output from the external cavity laser light source and output a detection signal indicating an intensity of the laser light, and an AD converter configured to repeatedly convert a value of the detection signal output from the detector to a digital value and output the digital value with a frequency higher than a frequency of repeating on/off of pumping of the optical amplification medium based on the instruction of the pumping instruction signal in each period of the wavelength sweep, obtaining an oscillation spectrum on the basis of the digital value output from the AD converter in each period of the wavelength sweep and integrating the oscillation spectra obtained with changing the phase of the pumping instruction signal by the signal generation unit for each period of the wavelength sweep to obtain a spectrum of the laser light output from the external cavity laser light source.

9. The spectrum measurement method according to claim 8, wherein the signal generation unit is configured to generate the wavelength sweep signal on the basis of a reference clock having a constant period, generate the pumping instruction signal having a period being 1/integer of a period of the wavelength sweep signal, and adjust the phase of the pumping instruction signal with a unit of a phase corresponding to a time of 1/integer of the period of the pumping instruction signal.

10. The spectrum measurement method according to claim 8, wherein no terminating resistor is provided on an input terminal of the AD converter.

11. The spectrum measurement method according to claim 8, wherein the integration of the oscillation spectra is performed until a ratio of a fluctuation range to a height of a center line in a spectrum shape of the integration result becomes smaller than a predetermined threshold value.

12. The spectrum measurement method according to claim 8, wherein the optical amplification medium is a quantum cascade laser.

13. The spectrum measurement method according to claim 8, wherein the wavelength selection unit is a reflection type diffraction grating provided on one end of the cavity and having a variable tilt angle, and is configured to select the resonant wavelength corresponding to the tilt angle of the diffraction grating.

14. The spectrum measurement method according to claim 13, wherein the diffraction grating is a MEMS device.

* * * * *